United States Patent
Zhang (10) Patent No.: US 9,437,453 B2
(45) Date of Patent: Sep. 6, 2016

(54) CONTROL OF WAFER SURFACE CHARGE DURING CMP

(71) Applicant: STMicroelectronics, Inc., Coppell, TX (US)

(72) Inventor: John H. Zhang, Altamont, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/231,533

(22) Filed: Mar. 31, 2014

(65) Prior Publication Data

US 2015/0279695 A1    Oct. 1, 2015

(51) Int. Cl.
| | |
|---|---|
| *H01L 21/302* | (2006.01) |
| *H01L 21/321* | (2006.01) |
| *H01L 21/67* | (2006.01) |
| *B24B 37/005* | (2012.01) |
| *H01L 21/02* | (2006.01) |
| *H01L 21/66* | (2006.01) |

(52) U.S. Cl.
CPC ......... *H01L 21/3212* (2013.01); *B24B 37/005* (2013.01); *H01L 21/02074* (2013.01); *H01L 21/67207* (2013.01); *H01L 21/67219* (2013.01); *H01L 22/14* (2013.01); *H01L 22/20* (2013.01)

(58) Field of Classification Search
CPC . B24B 37/042; B24B 37/046; B24B 37/345; H01L 21/3212; H01L 21/67207; H01L 21/67219; H01L 21/02074
USPC .................................................. 438/689–692
See application file for complete search history.

(56) References Cited

U.S. PATENT DOCUMENTS

| | | | | |
|---|---|---|---|---|
| 6,982,174 | B2* | 1/2006 | Bonnell et al. | 438/3 |
| 8,336,148 | B2* | 12/2012 | Zhang | 15/88.3 |
| 8,557,006 | B2* | 10/2013 | Hou et al. | 51/308 |
| 2006/0267622 | A1* | 11/2006 | Lagowski et al. | 324/765 |

OTHER PUBLICATIONS

Hegde, S. and Babu. S.V., "Study of Surface Charge Effects on Oxide and Nitride Planarization Using Alumina/Ceria Mixed Abrasive Slurries" *Electrochemical and Solid-State Letters*, 7 (12) G316-G318. (2004) The Electromechanical Society, Inc.

* cited by examiner

*Primary Examiner* — Duy Deo
*Assistant Examiner* — Maki Angadi
(74) *Attorney, Agent, or Firm* — Seed IP Law Group PLLC (57) ABSTRACT

CMP selectivity, removal rate, and uniformity are controlled both locally and globally by altering electric charge at the wafer surface. Surface charge characterization is performed by an on-board metrology module. Based on a charge profile map, the wafer can be treated in an immersion bath to impart a more positive or negative charge overall, or to neutralize the entire wafer before the CMP operation is performed. If charge hot spots are detected on the wafer, a charge pencil can be used to neutralize localized areas. One type of charge pencil bears a tapered porous polymer tip that is placed in close proximity to the wafer surface. Films present on the wafer absorb ions from, or surrender ions to, the charge pencil tip, by electrostatic forces. The charge pencil can be incorporated into a CMP system to provide an in-situ treatment prior to the planarization step or the slurry removal step.

13 Claims, 10 Drawing Sheets

CONTROL OF WAFER SURFACE CHARGE DURING CMP

BACKGROUND

1. Technical Field

The present disclosure relates to control of electrostatic charging effects during fabrication of integrated circuits and, in particular, to a system and method for evaluating and adjusting wafer surface charge, in-situ, during a chemical-mechanical planarization (CMP) operation.

2. Description of the Related Art

CMP is a combination chemical and mechanical polishing technique used in the semiconductor industry to planarize the surface of a semiconductor wafer at various times during an integrated circuit fabrication process. A CMP process typically entails polishing the wafer surface using a rotating polishing pad and a slurry made from various chemicals and abrasive particulates, so that both chemical and physical removal mechanisms contribute to the planarization. Following the polishing, the wafer undergoes a cleaning step in which rotating brushes clean off the slurry. Typically, it is desirable to planarize the wafer surface after completing deposition and patterning of one or more film layers, before proceeding to deposit a next layer of material. If planarization is omitted, uneven surface topography of the un-planarized surface can be transferred to, or accentuated in, subsequent layers. If a film is not sufficiently flat across the entire wafer, it may fail to present a surface that remains in focus during a subsequent lithography step. Such non-uniform topography effects are more likely to occur if materials used in subsequent layers are conformal to the wafer and thus do not evenly fill surface recesses.

CMP selectivity is defined as the ratio of the removal rate of a second film to the removal rate of a first film. A high selectivity, for example 100:1, would remove only 0.5 nm of the first film for every 50 nm of the second film, whereas a poor selectivity, e.g., 1:1, would remove the same amount of each film. CMP selectivity is affected by many factors during processing, including chemical concentrations within the slurry, pressure of the pad, and rotation speed of the pad. As device dimensions decrease below 20 nm, CMP selectivity has a greater effect on device performance.

Historically, control of the selectivity has relied upon characterization of the slurry by the slurry supplier. Slurries used for CMP typically include chemically active abrasives such as silica ($SiO_2$), ceria ($CeO_2$), alumina($Al_2O_3$), titania ($TiO_2$), or zirconia ($ZrO_2$), as well as mechanical abrasives such as diamond and silicon carbide (SiC). It is understood that slurry particle size can affect wafer charging by affecting interfacial chemical reactions. Accordingly, slurry manufacturers have learned to control the surface functionality of CMP slurry by adjusting the sizes and spatial relationships of slurry nanoparticles. Such adjustments can be made, for example, by synthesizing fumed, precipitated, or amorphous forms of the slurry compounds, each of which can have a different charging effect on wafers. The ionic composition of slurries can also affect wafer charging, such as, for example, the presence of $Ce^{3+}$ and $Ce^{4+}$ ions in a ceria-based slurry. In addition to the ionic composition of the slurry, pH can also affect wafer charging. Slurries can further include chemical additives such as corrosion inhibitors, chelators, biocides, colloidal stabilizers, rate accelerators, oxidizers, surfactants, passivating agents, and dispersible polymers. For example, colloidal silica-based slurries are preferred for use in copper CMP, while fumed silica is preferred for oxide or tungsten CMP.

Once the slurry is evaluated and the selectivity of the slurry chemistry is determined, process engineers hope to find that the CMP selectivity is uniform across the entire wafer. However, in practice, local irregularities can modify the selectivity, causing hot spots where non-uniform planarization occurs. Such hot spots can be very costly if, for example, they were to cause too much metal to be removed at one of the last layers in the process, thus causing product to be scrapped after the maximum investment in manufacturing has already been made. One such local irregularity is electrostatic charge concentrated in a particular location on the surface of the wafer. Surface charge tends to accumulate due to friction during CMP and during the subsequent brush cleaning step, especially when planarizing metal layers. Surface charging can further be affected by the pH of the slurry such that the surface becomes, for example, increasingly more negative as the pH increases. In addition, the slurry particle size can affect the type of charging that occurs. Surface charge can also be imparted to the wafer by electrostatic chucks that hold the wafer in place during plasma processing at deposition or etching operations upstream of the CMP step. A general trend has been observed that after CMP, the surface potential becomes more negative. Although this is the case for all types of films, the surface charging is more obvious on insulator films than metal films. Furthermore, if a particular location on the wafer is charged prior to CMP, the charge is maintained and increased after CMP.

The connection between charging and selectivity is based on experimental observations of the film removal rate changing in response to the charge on the slurry particles relative to the wafer charge. This is particularly true for silica-based and ceria-based slurries. If the slurry charge is opposite that of the wafer, such that charge attraction occurs, there is more opportunity for interaction of the chemical reactants, which increases the reaction rate. The increase in chemical reaction rate results in a higher film removal rate during CMP. In areas where the charge polarity of the wafer matches that of the slurry, charge repulsion causes a reduction in the removal rate. Thus, the ability to control or to neutralize charging allows control of CMP selectivity, both globally and locally.

BRIEF SUMMARY

CMP selectivity, removal rate, and uniformity are controlled both locally and globally by adjusting electric charge at the wafer surface. Wafer surface charge characterization is performed by an on-board metrology module as part of the CMP operation, to determine whether the whole wafer is charged negative or positive, or whether certain localized regions of the wafer exhibit hot spots corresponding to a higher degree of charging. Based on the surface charge measurements, the wafer can be treated in-situ using an immersion bath to impart a more positive or negative charge, or to perform a charge neutralization process on the entire wafer before the CMP operation is performed. Alternatively, if charge hot spots are detected on the wafer, the local charge can be adjusted prior to the CMP operation, using a charge pencil. The charge pencil bears a tapered porous polymer tip that absorbs and applies an ionic solution to a localized region of the wafer surface. Films present on the wafer absorb the ionic solution from the charge pencil. The charge pencil can be incorporated into the CMP equipment to provide an in-situ treatment after the characterization step and directly before the planarization step. Planarization is then followed by a slurry removal operation as usual. Use of charge assessment and adjustment can be generalized and extended to other processes as well. By adjusting the electric charge at the surface of the wafer, die yields and wafer yields can be improved to reduce manufacturing costs.

A method and system for neutralizing global surface charge on a wafer is disclosed in U.S. Pat. No. 8,336,148, granted on Dec. 25, 2012 to the same inventor as the inventor of this patent application. However, methods disclosed in the '148 patent address do not address neutralization of localized surface charge. Furthermore, the '148 patent does not address a system that is capable of evaluating which type of surface charge is present on a particular wafer and, in response, providing solutions for neutralizing global and/or local surface charge as needed.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of wafer planarization, wafer cleaning, wafer transport, and the like, comprising embodiments of the subject matter disclosed herein, have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable.

Specific embodiments are described herein with reference to CMP systems and charge adjustment modules or devices that have been produced; however, the present disclosure and the reference to certain materials, dimensions, and the details and ordering of processing steps are exemplary and should not be limited to those shown.

Figure 1:
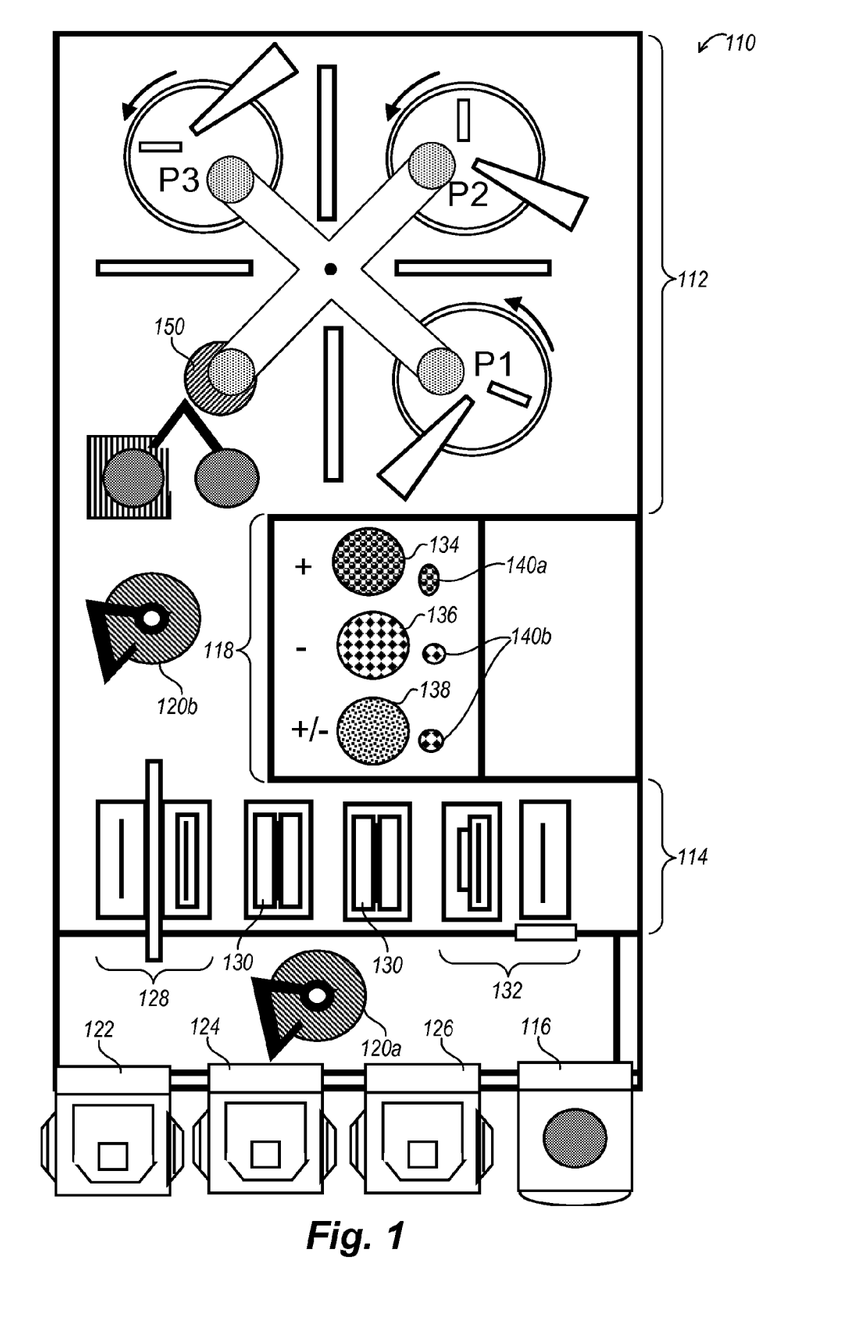
FIG. 1 is a block diagram showing components of a CMP system, according to one exemplary embodiment described herein.

Turning now to the figures, FIG. 1 shows an inventive CMP system 110 for use in fabricating integrated circuits on semiconductor wafers, according to one exemplary embodiment described herein. The CMP system 110 is configured to evaluate and neutralize electrostatic charge on wafers just prior to performing a CMP operation or just after the CMP operation, prior to a post-CMP cleaning operation.

The CMP system 110 includes a planarization module 112, a cleaning module 114, a metrology module 116, and a charge adjustment module 118 that is equipped to neutralize both global and localized charge on a wafer 150. In addition, the CMP system 110 includes one or more automated wafer transport mechanisms, e.g., robots 120a,b (two shown), operable to move semiconductor wafers between the different modules. For example, the robot 120a is positioned to load wafers to and from loading stations 122, 124, and 126, into and out of the CMP system 110 for processing. In addition, the robot 120a is operable to load single wafers into and out of the metrology module 116 for evaluating electrostatic charge accumulation across the wafer surface. The robot 120b is positioned to move single wafers between the planarization module 112, the charge adjustment module 118, and the cleaning module 114.

Wafer surface charging is often attributed to friction during wafer transport. In addition, some wafer transport robots use an electrostatic chuck to hold the wafer, which directly affects surface charge on the back side. Furthermore, upstream operations such as thin film deposition or reactive ion etching processes can impart charge to the wafer during processing in a plasma environment, in the presence of high power RF or microwave radiation. It is understood by those skilled in the art of CMP that charging spots on the wafer surface that exist prior to CMP tend to remain and become enlarged during CMP processing. Then, at downstream photolithography operations, the accumulated charge can cause alignment errors and/or distortion during transfer of the mask pattern to surface films.

Subcomponents of the planarization module 112 include three processing modules, each processing module equipped with a platen, P1, P2, and P3. Each platen applies a particular slurry to a wafer via a rotating polishing pad according to a particular recipe so as to planarize the wafer surface, as is well known in the art. In addition to slurry affecting wafer charging, charging can also occur during CMP processing due to friction, especially at metal CMP operations.

Platens P1, P2, and P3 generally are operable in parallel, and each processing module may be configured to execute a different recipe on wafers that are at different stages of processing. For example, P1 can process a wafer from loading station 122 at the metal 1 layer, while P2 is processing a wafer from loading station 124 at metal 3. Meanwhile, P3 can be processing a wafer from loading station 126 at a dielectric planarization step. In another example, all three planarization modules can be configured to execute the same recipe, and the CMP system 110 can be programmed to load wafers from any one of the loading stations into any one of the three planarization modules.

Subcomponents of the post-planarization cleaning module 114 include, for example, a megasonics stage 128, a brush cleaning stage 130, and a dryer stage 132. In the megasonics stage 128, wafers are immersed in a fluid contained in a tank that is set to vibrate at high frequency. The high frequency vibrations dislodge slurry particles into the fluid so they can be flushed away. In the brush cleaning stage 130, wafers are rotated upright between sets of brushes that scrub off remaining slurry particles. The brush cleaning stage 130 can include two rounds of brush cleaning, first in a dirty tank, followed by processing in a clean tank. Friction during brush cleaning, as well as the pH of the fluid, can affect wafer charging.

Figure 2A:
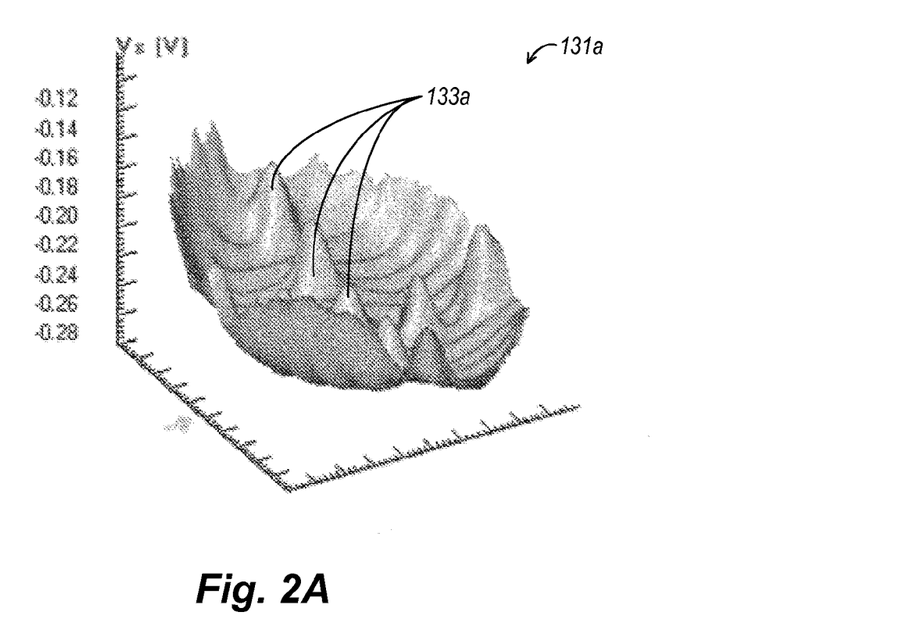
FIG. 2A is a 3-D in-situ surface charge profile of a tantalum nitride (TaN) film on a semiconductor wafer as measured by a wafer metrology module that is part of the CMP system shown in FIG. 1.
Figure 2B:
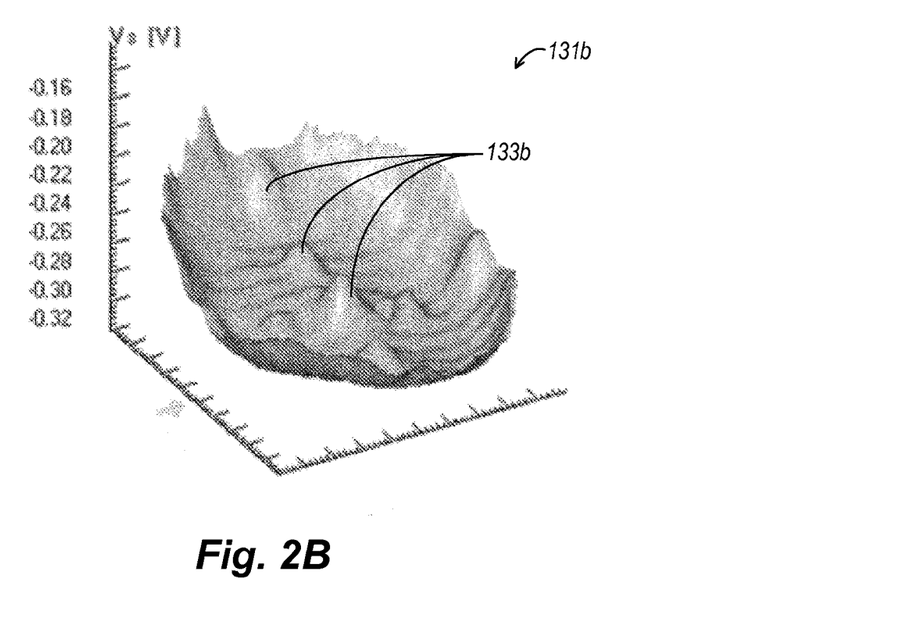
FIG. 2B is a 3-D in-situ charge profile of the TaN wafer shown in FIG. 2A following CMP processing.

The metrology module 116 is configured to measure electrostatic charge at various surface locations on the wafer, to produce charge profile data in the form of a charge profile map, as shown in FIGS. 2A and 2B. Such measurements can be made to characterize either the top side or the back side of a wafer. Once the charge profile is known, the charge distribution can be evaluated in-situ by comparing to an independent standard, or to a statistical standard based on measurements of similar wafers. When the metrology module 116 is used prior to CMP processing, a decision can be made based on the charge profile, whether or not to neutralize the charge before processing. Additionally or alternatively, the planarization recipe can be altered to compensate for the presence of electrostatic charge, which may affect the selectivity or uniformity of the planarization process.

FIGS. 2A and 2B show plots of surface voltage $V_s$ measured, by the metrology module 116, on a wafer that has a titanium nitride (TiN) surface layer. Because the source of $V_s$ is electrostatic surface charge, each plot provides a 3-D charge profile map. Tall peaks 133a shown in a charge profile map 131a represent points on a wafer surface at which charge has accumulated prior to CMP processing with slurry in the planarization module 112. FIG. 2B shows a similar charge profile map 131b of the same wafer in the same alignment, following planarization processing. The charge profile 131b exhibits shorter peaks 133b, indicating that the electrostatic charge present on the wafer has been modified during the CMP process. The peaks 133a, 133b indicate areas of localized charge that can be addressed using techniques described herein. Inventive aspects of the CMP system 110 include, in particular, the charge adjustment module 118, and various wafer paths through the CMP system 110 that are executed, according to methods described herein, in response to surface charge measurements obtained at the metrology module 116. Such aspects are discussed in more detail below.

The charge adjustment module 118 includes global charge adjustment sub-modules 134, 136, and 138. In one embodiment, the global charge adjustment sub-modules are immersion baths containing ionic solutions.

For example, global charge adjustment sub-module 134 is shown in FIG. 2 as an immersion bath containing a positive ionic solution (e.g., a liquid) that imparts an overall positive charge to the wafer surface. Likewise, global charge adjustment sub-module 136 is shown in FIG. 1 as an immersion bath containing a negative ionic solution that imparts an overall negative charge to the wafer surface. Global charge adjustment sub-module 138 is shown in FIG. 1 as an immersion bath containing an overall charge neutralization solution.

Figure 3:
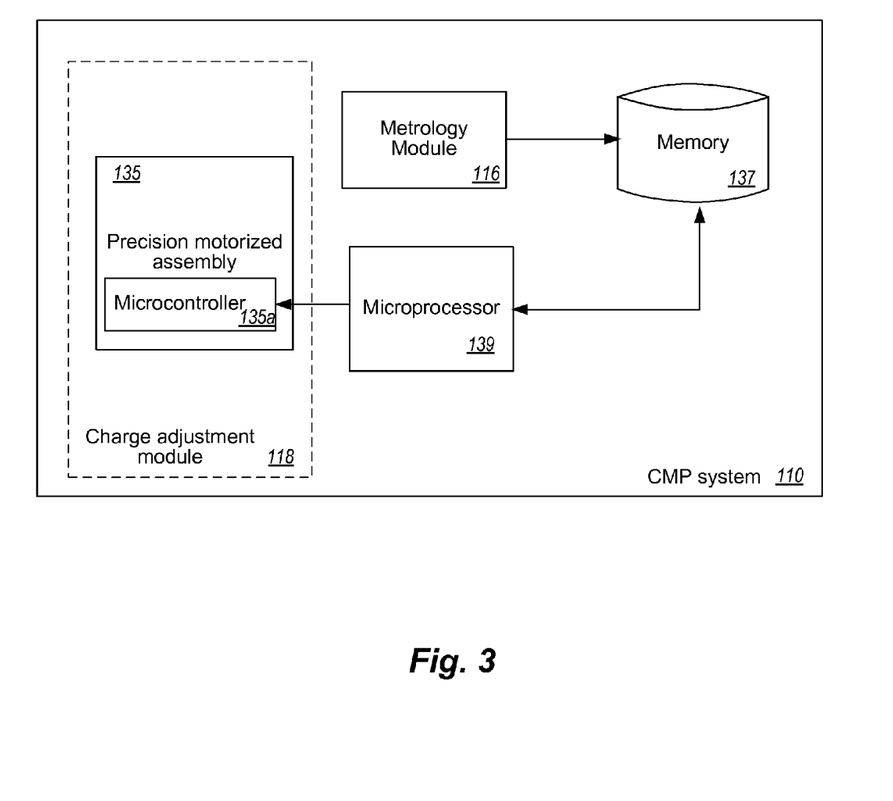
FIG. 3 is a block diagram showing computerized control of a charge pencil, via a programmable precision motorized assembly, according to one embodiment.
Figure 4:
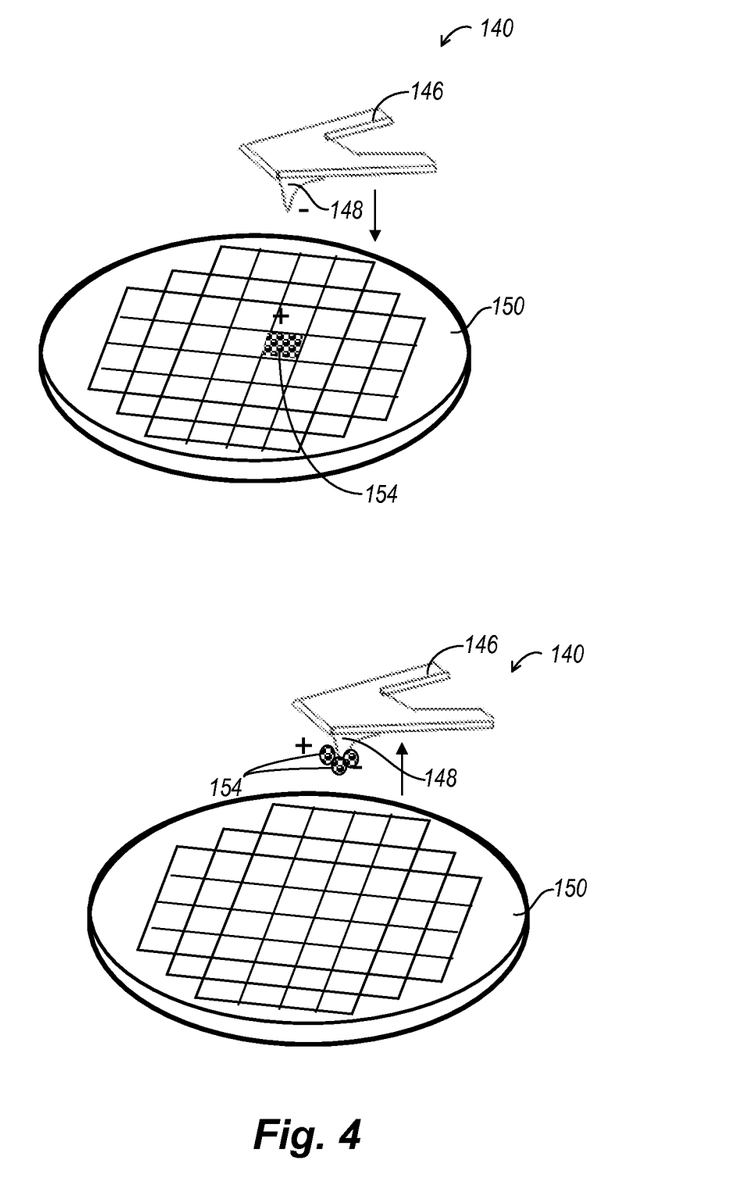
FIG. 4 is a pictorial view showing operation of the charge pencil, according to a first embodiment described herein.
Figure 6:
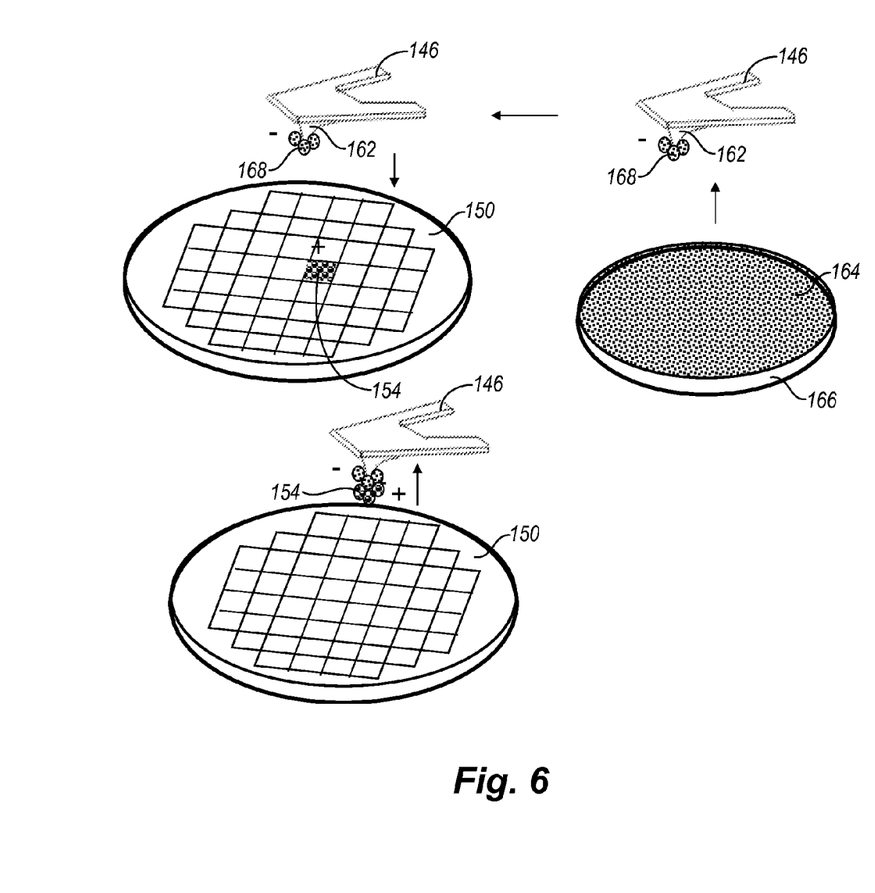
FIG. 6 is a pictorial view showing operation of a charge pencil, according to a second embodiment described herein.
Figure 8:
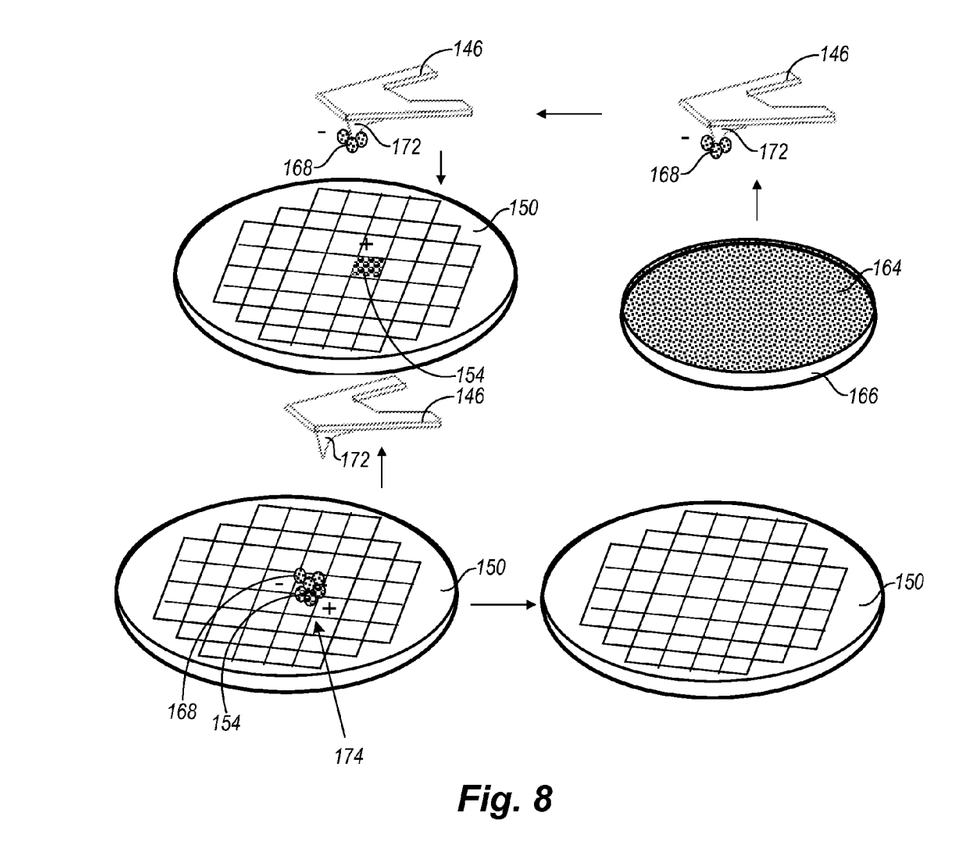
FIG. 8 is a pictorial view showing operation of a charge pencil, according to a third embodiment described herein.

With reference to FIG. 3, the charge adjustment module 118 of the CMP system 110 further includes a programmable precision motorized assembly 135 that is equipped with a microcontroller 135a and one or more charge pencils 140 for carrying out local charge adjustment. Embodiments of the charge pencils are shown in FIGS. 4, 6, and 8. The precision motorized assembly 135 operates in response to programmed instructions stored in an electronic memory 137 and executed by a microprocessor 139. In general, precision motorized assemblies 135 are well known in the art of metrology, e.g., an assembly for positioning a probe tip.

Therefore, details of the precision motorized assembly 135 in the charge adjustment module 118 are omitted from the present description. The electronic memory 137 and microprocessor 139 are desirably part of the CMP system 110, however, they may be external to the CMP system 110 and still control methods of local charge adjustment carried out in the charge adjustment module 118 from a remote location.

Three charge pencils 140 are indicated in FIG. 1. The charge pencil 140a as shown carries a positive charge while the two charge pencils 140b each carry a negative charge. Components of the charge pencils 140a,b include a head 146 and interchangeable tips 148, 162, and 172. The head 146 is desirably made of an insulating material such as Teflon™ or plastic so as not to interfere with electrostatic charge present on the tip. The head 146 is configured to be coupled mechanically and electrically to the motorized assembly so that an electrical signal can be supplied to the tips.

The charge pencil 140 is configured for use in removing or depositing positive or negative charge at a localized spot on the wafer surface as described below with reference to FIGS. 3-4, 5-6 and 7-8. It is noted that each of the FIGS. 4, 6, and 8 shows a separate time sequence of actions involving a single exemplary wafer 150. FIG. 3 shows a first embodiment of a charge pencil 140, the operation of which is described in FIG. 4. In the first embodiment, the charge pencil 140 is configured with a pointed tip 148 that is electrically coupleable to a voltage source to remove electrostatic charge from a specific location on the surface of the wafer 150. The pointed tip 148 is desirably made of a conducting material so that the pointed tip 148 can be biased to a selected voltage relative to the surface of the wafer 150. The motorized assembly, thus equipped with the charge pencil 140, positions the pointed tip 148 very close to the surface of the wafer 150 without actually contacting the surface.

Figure 5:
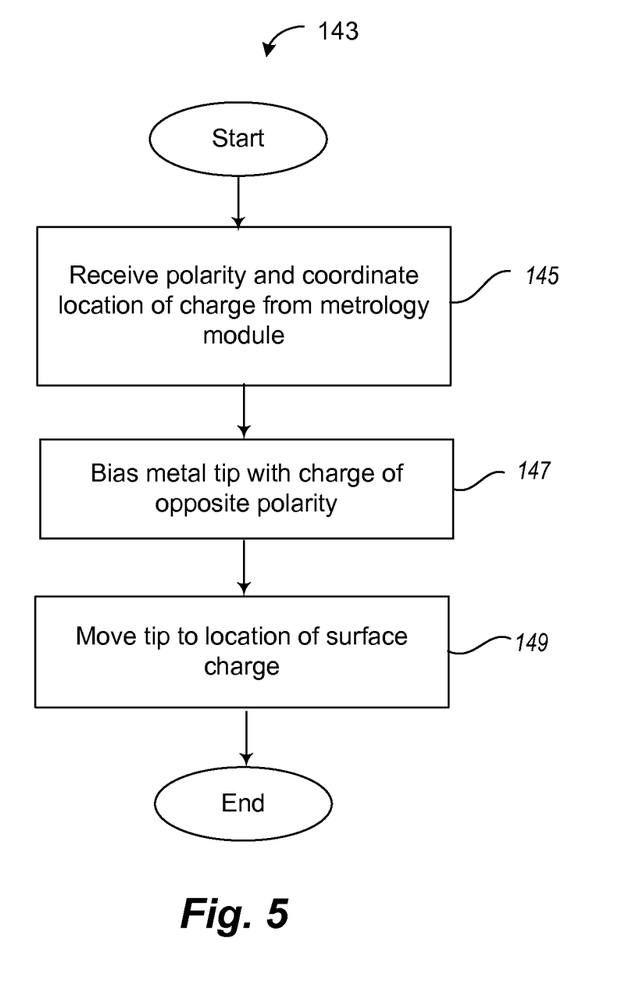
FIG. 5 is a process flow diagram showing a sequence of processing steps that can be used to operate the charge pencil shown in FIG. 4.

With reference to FIGS. 4 and 5, in a first embodiment, the CMP system 110 is programmed to remove surface charge 154 by executing a method 143 having the following sequence of steps:

At 145, the CMP system 110 receives data from the on-board metrology module 116, including the polarity and coordinate location of the surface charge 154. The surface charge 154 is shown in the figures as a positive charge, as an example, but such a surface charge alternatively could have negative polarity.

At 147, the pointed tip 148 is biased to a voltage that exceeds the electric potential of the surface charge and which has opposite polarity from the surface charge 154. Thus, if the surface charge 154 is positive as shown, the pointed tip 148 is biased to be negative so as to attract the surface charge 154.

At 149, a motorized assembly equipped with the charge pencil 140 positions the pointed tip 148 of the charge pencil 140 at a point above the coordinate location, in close proximity to the surface charge 154. Positive charge on the wafer surface will then be attracted to the negative pointed tip 148 and will leave the wafer surface and adhere to the pointed tip 148 by electrostatic forces.

FIG. 6 shows a second embodiment of the charge pencil 140 that is configured to remove electric charge from a specific location on the surface of the wafer 150. According to the second embodiment, the charge pencil 140 has an absorbent tip 162 that can take up and hold an ionic solution 164 having a net ionic solution charge 168. The ionic solution 164 can be in the form of a liquid, but it is more desirably in the form of a gel having a higher viscosity than a liquid, thus allowing the ionic solution 164 to stay in place on the absorbent tip 162. The absorbent tip 162 is desirably made of a spongy, porous, insulating material so that the absorbent tip 162 can transport the ionic solution 164 from a fluid reservoir 166 to the surface of the wafer 150. The ionic solution can take other forms such as, for example, an aerosol that facilitates gathering charge onto the absorbent tip by simply holding the tip in an aerosol-filled environment.

Figure 7:
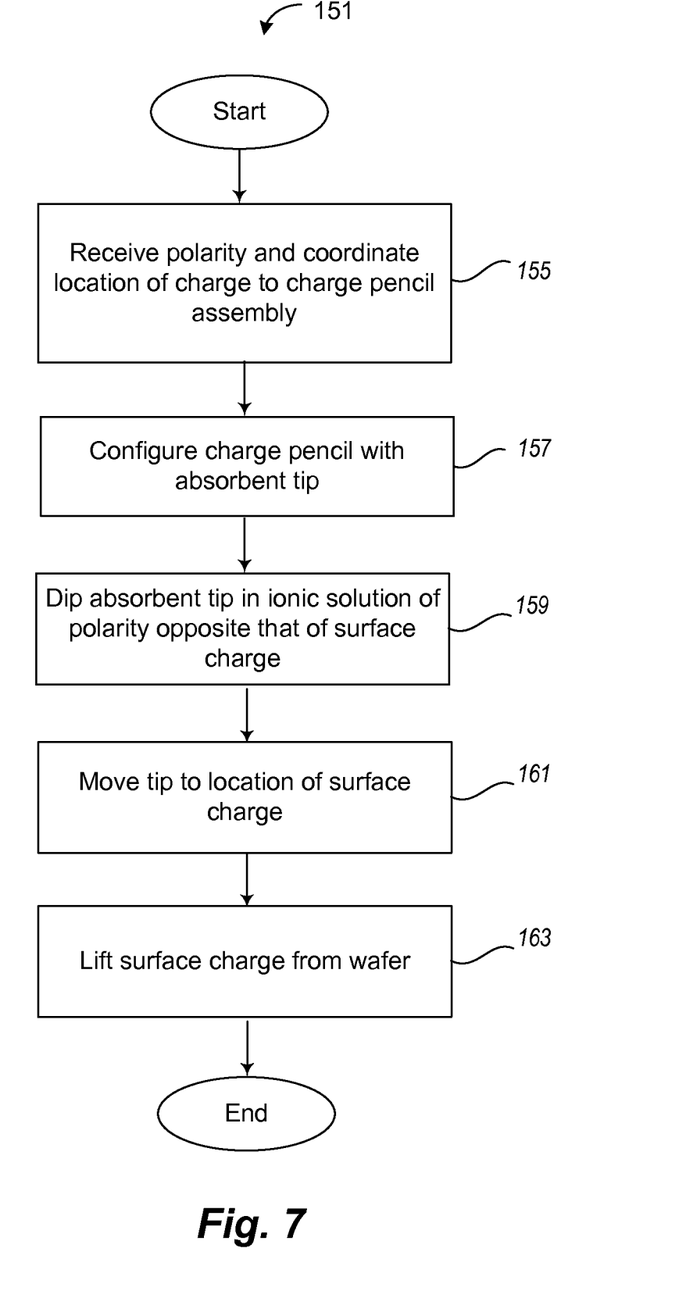
FIG. 7 is a process flow diagram showing a sequence of processing steps that can be used to operate the charge pencil shown in FIG. 6.

With reference to FIGS. 6 and 7, in the second embodiment, the motorized assembly equipped with the charge pencil 140 is programmed to remove surface charge 154 by executing a method 151 having the following sequence of steps:

At 155, the motorized assembly associated with the charge pencil 140 receives information from the metrology module 116 including the polarity and coordinates specifying the location of the surface charge 154.

At 157, the charge pencil 140 is configured with the absorbent tip 162.

At 159, the motorized assembly executes instructions to move the charge pencil to the reservoir 166 and dip the absorbent tip into the ionic solution in which the net ionic solution charge 168 has a polarity opposite that of the surface charge. In FIG. 6, for example, the surface charge to be removed is shown as positive and the ionic solution charge 168 is negative.

At 161, the charge pencil moves to a point above the coordinate location, in close proximity to the surface charge 154. The positive surface charge 154 is then attracted to the negatively charged ionic solution held in the absorbent tip 162.

At 163, the absorbent tip 162 lifts the positive surface charge 154 from the wafer 150 via the attractive electrostatic force.

FIG. 8 shows a third embodiment of the charge pencil 140 that is configured to deposit electrostatic charge at a specific location on the surface of the wafer 150. According to the third embodiment, the charge pencil 140 is configured with a second absorbent tip 172. The second absorbent tip 172 includes a wire or other metallic portion that is electrically coupleable to a voltage source so that a selected bias voltage applied to the tip 172 can cause a release of electrostatic charge at a specific location on the surface of the wafer 150.

Figure 9:
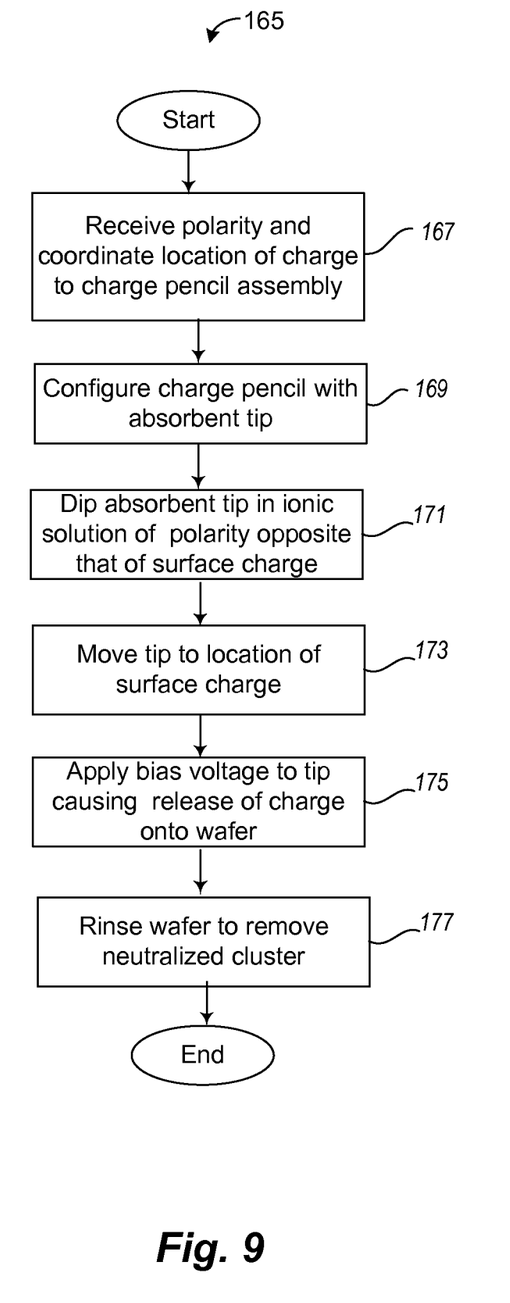
FIG. 9 is a process flow diagram showing a sequence of processing steps that can be used to operate the charge pencil shown in FIG. 8.

With reference to FIGS. 8 and 9, in the third embodiment, the motorized assembly equipped with the charge pencil 140 is programmed to deposit a negative charge at the location of surface charge 154 by executing a method 165 having the following sequence of steps:

At 167, the motorized assembly associated with the charge pencil 140 receives information from the metrology module 116 including the polarity and coordinates specifying the location of the surface charge 154.

At 169, the charge pencil 140 is configured with the absorbent tip 162.

At 171, the motorized assembly executes instructions to move the charge pencil to the reservoir 166 and dip the absorbent tip into the ionic solution in which the ionic solution charge 168 has a polarity opposite that of the surface charge. In FIG. 7, for example, the surface charge 154 to be removed is shown as positive and the ionic solution charge 168 is negative.

At 173, the charge pencil moves to a point above the coordinate location, in close proximity to the surface charge 154.

At 175, the tip 172 is biased to a voltage that exceeds the electric potential of the ionic solution charge 168 and which has opposite polarity from the ionic solution charge 168.

Thus, if the surface charge 154 is positive as shown, and the ionic solution charge 168 is negative, the tip 172 is biased positive to repel the ionic solution charge 168 from the tip, thereby depositing negative charge onto the wafer. The deposited negative charge is then attracted to the positive surface charge 154, forming a neutralized cluster 174.

At 177, the wafer 150 is rinsed in the cleaning module 114 to remove neutralized clusters 174 from the wafer surface.

Figure 10:
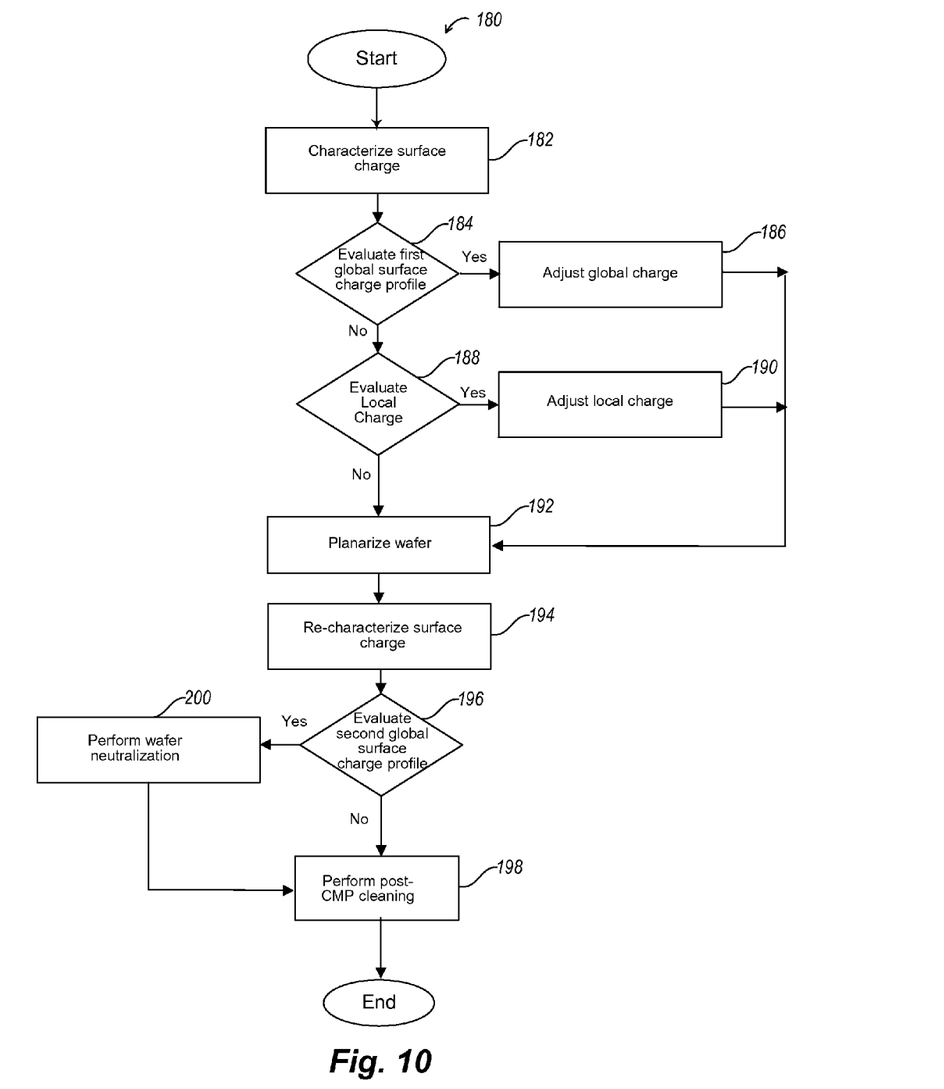
FIG. 10 is a flow diagram showing a sequence of steps in an exemplary method of operating the CMP system shown in FIG. 1.

FIG. 10 describes an exemplary method of operation 180 of the CMP system 110, according to one embodiment. The method of operation 180 is carried out by programming the microprocessor 139 associated with the CMP system 110 that is configured to activate the various modules 112, 114, 116, and 118, sub-modules, and components therein. For example, the microprocessor 139 may download instructions to the microcontroller 135a within the charge adjustment module 118. The program instructions executed by the microprocessor 139 are stored in an electronic memory that may be internal or external to the CMP system. In the case that the electronic memory containing the program instructions is external to the CMP system, the instructions can be downloaded into the CMP electronic system memory 137 for execution, for example, in response to a request from an operator of the CMP system.

At 182, the wafer transport robot 120a moves a wafer from one of the loading stations 122, 124, or 126, to the metrology module 116, wherein charge residing on the surface of the wafer is characterized to produce a charge profile map, e.g., 131a.

At 184, the charge profile map is uploaded from the metrology module 116 to the electronic memory 137 for evaluation. The microprocessor 139 then accesses the charge profile map 131a, stored in the electronic memory 137, and executes a program to assess features of the charge profile map 131a, such as peaks 133a, and to make a decision, according to programmed criteria, as to whether global charge adjustment is needed. In one embodiment, evaluation of the charge profile map 131a can involve receiving input from a user. Furthermore, at 184, a recommendation for a certain CMP process recipe may be determined and uploaded to the planarization module 112 for later use. The microprocessor 139 and the electronic memory 137 may be part of the CMP system 110, or they may be part of a remote system in communication with the CMP system 110.

At 186, if the decision made at step 184 is yes, the wafer is moved to a global charge adjustment sub-module 134 for immersion in an ionic solution.

At 188, the microprocessor-based system evaluates features of the charge profile map 131a, and makes a decision based on programmed criteria, as to whether localized charge adjustment is needed.

At 190, if the decision made at step 188 is yes, the wafer is moved to the charge adjustment module 118 for localized treatment via the charge pencil 140 as described above.

At 192, following any treatments performed at 186 and/or 190, the robot 120b moves the wafer from the charge adjustment module 118 to the planarization module 112 for CMP slurry-based processing. Prior to moving the wafer into the planarization module 112, if a process recipe recommendation has been determined based on the charge profile map 131a created in the metrology module 116, the recipe is downloaded to the specific planarization sub-module that is selected to process the wafer. For example, the process recipe may call for a particular type of slurry, or a specific slurry formulation, based on the charge profile for that wafer.

At 194, following planarization, the robot 120b moves the wafer back to the metrology module 116 to re-characterize the surface charge, obtaining a second set of charge data in the form of a 3-D after-CMP charge profile map, e.g., 131b.

At 196, the 3-D after-CMP charge profile map 131b is evaluated to determine whether or not wafer neutralization is needed prior to the post-CMP cleaning step to be carried out in the cleaning module 114. The evaluation at 196 can also include downloading a specialized cleaning recipe to the cleaning module 114 based on the after-CMP charge profile map 131b.

At 198, if it is determined that wafer neutralization is not needed, the robot 120a moves the wafer to the cleaning module 114 for a post-CMP wafer scrubbing treatment. Following the post-CMP wafer scrub, the robot 120a returns the wafer to the loading station 122, 124, or 126.

At 200, if it is determined that wafer neutralization is needed, the robot 120a moves the wafer to the charge adjustment module 118 for global wafer neutralization before proceeding to the wafer cleaning module 114 for the post-CMP scrub treatment at 198.

Thus, the CPM system 110 has in-situ capability to detect wafer charging, evaluate charge data, provide both global and localized charge neutralization treatment prior to key CMP and cleaning steps, and provide feedback control to both the planarization and cleaning operations.

The various embodiments described above can be combined to provide further embodiments.

All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. For example, additional embodiments may use the charge pencil 140 configured with the tips shown above in a different operational sequence, or the charge pencil 140 may be configured with different tips. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    receiving a first set of surface charge data and local surface charge for a surface of a semiconductor wafer;
    evaluating the first set of surface charge data to determine whether or not a global charge treatment is needed;
    based on the first set of surface charge data, applying a global charge treatment to the entire wafer;
    evaluating local surface charge data at a plurality of specific local regions on the wafer to determine whether or not a local charge treatment is needed at the specific local regions;

based on the local surface charge data, applying a local charge treatment to substantially neutralize the specific local regions of the surface of the semiconductor wafer; and performing a chemical-mechanical planarization (CMP) process.

2. The method of claim 1, further comprising receiving a second set of surface charge data for the surface of the semiconductor wafer;

evaluating the second set of surface charge data to determine whether or not the entire wafer needs a charge neutralization procedure;

based on the second set of surface charge data, applying a charge neutralization treatment to the entire wafer; and performing a post-CMP wafer cleaning procedure.

3. The method of claim 2 wherein one or both of the global charge treatment and the charge neutralization treatment further comprises immersing the wafer in an ionic solution.

4. The method of claim 1 wherein applying a local charge treatment includes electrically biasing a charge pencil tip; and removing surface charge from a localized area of the surface of the semiconductor wafer by placing the tip in close proximity to the localized area.

5. The method of claim 1 wherein applying a local charge treatment includes applying an ionic solution to a charge pencil tip; and removing surface charge from a localized area of the wafer by placing the tip in close proximity to the localized area.

6. The method of claim 5, further comprising electrically biasing the charge pencil tip.

7. The method of claim 1 wherein applying a local charge treatment further comprises removing charge of a known polarization from the surface of the wafer using a charge pencil that carries an oppositely polarized electrostatic charge to form a substantially neutralized region on the surface of the semiconductor wafer.

8. The method of claim 1 wherein applying a local charge treatment further comprises depositing charge of a known polarization onto the surface of the wafer using a charge pencil, the deposited charge together with the surface charge forming a substantially neutralized cluster.

9. The method of claim 8, further comprising removing the substantially neutralized cluster from the wafer via a wet cleaning process.

10. A method, comprising:

receiving from a metrology module within a wafer processing system, polarity and location data associated with surface charge accumulated on a surface of a semiconductor wafer;

charging a tip of a charge pencil to have a net charge of opposite polarity to that of the surface charge on the wafer;

positioning, via a precision motorized assembly, the tip of the charge pencil in close proximity to the surface at a location of the surface charge; and altering the surface charge on the wafer via an electrostatic force associated with the charge of opposite polarity at the tip of the charge pencil.

11. The method of claim 10 wherein altering the surface charge on the wafer further includes removing the surface charge from the wafer by attracting the surface charge to the tip, and retracting the tip away from the surface.

12. The method of claim 10 wherein altering the surface charge on the wafer further includes neutralizing the surface charge by releasing charge of opposite polarity from the tip by applying a voltage thereto.

13. The method of claim 10 wherein charging the tip of the charge pencil includes gathering ions onto the tip by absorption of an ionic solution.

* * * * *